(12) United States Patent
Park

(10) Patent No.: US 8,225,171 B2
(45) Date of Patent: Jul. 17, 2012

(54) SEMICONDUCTOR MEMORY DEVICE HAVING AN ERROR CORRECTION FUNCTION AND ASSOCIATED METHOD

(75) Inventor: Bok-Gue Park, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 1190 days.

(21) Appl. No.: 12/071,024

(22) Filed: Feb. 14, 2008

(65) Prior Publication Data

US 2008/0294934 A1 Nov. 27, 2008

(30) Foreign Application Priority Data

Feb. 16, 2007 (KR) .................. 10-2007-0016584

(51) Int. Cl.
*G06F 11/00* (2006.01)
(52) U.S. Cl. ................. 714/758; 714/752; 714/754
(58) Field of Classification Search .................. 714/754, 714/764, 766, 768, 799, 800, 801, 802, 803, 714/804, 805, 6.24, 48, 52, 752, 758
See application file for complete search history.

(56) References Cited

U.S. PATENT DOCUMENTS

| | | | |
|---|---|---|---|
| 6,529,435 B2 | 3/2003 | Yagishita et al. | |
| 6,535,452 B2 | 3/2003 | Okuda et al. | |
| 7,107,390 B2 * | 9/2006 | Teng | 711/105 |
| 2003/0106010 A1 * | 6/2003 | Fujioka et al. | 714/763 |
| 2005/0283704 A1 | 12/2005 | Ito et al. | |
| 2006/0282755 A1 * | 12/2006 | Oh | 714/801 |

FOREIGN PATENT DOCUMENTS

| | | |
|---|---|---|
| JP | 2002-298578 | 10/2002 |
| JP | 2003-022694 | 1/2003 |
| JP | 2006-004560 | 1/2006 |

* cited by examiner

*Primary Examiner* — Scott Baderman
*Assistant Examiner* — Sarai Butler
(74) *Attorney, Agent, or Firm* — Lee & Morse, P.C.

(57) ABSTRACT

A semiconductor memory device may include a parity generating circuit, a memory cell array, an error calculating circuit and an error corrector. The parity generating circuit generates parities having different number of bits according to types of a partial array self-refresh mode, and selects one of the parities to output a first parity. The error calculating circuit calculates an error based on a first data corresponding to the input data and a second parity corresponding to the first parity and outputs a first error data. The error corrector corrects the first data based on the first data and the first error data.

20 Claims, 7 Drawing Sheets

| NO. OF DATA BITS | NO. OF ERROR BITS | NO. OF PARITY BITS | CELL OVERHEAD(%) |
|---|---|---|---|
| 8 | 1 | 4 | 50 |
| 16 | 1 | 5 | 31 |
| 32 | 1 | 6 | 18 |
| 64 | 1 | 7 | 10 |
| 128 | 1 | 8 | 6 |

FIG. 12

|  | FULL ARRAY | HALF ARRAY | QUARTER ARRAY |
|---|---|---|---|
| REFRESH PERIOD | T | LONGER THAN T | LONGER THAN THAT OF HALF ARRAY |
| NO. OF CORRECTABLE ERROR BITS | 1BIT PER 128BITS | MORE THAN 1BIT PER 128BITS | MORE THAN THAT OF HALF ARRAY |

SEMICONDUCTOR MEMORY DEVICE HAVING AN ERROR CORRECTION FUNCTION AND ASSOCIATED METHOD

BACKGROUND OF THE INVENTION

1. Field of the Invention

Embodiments relate to a semiconductor memory device and an associated method. More particularly, embodiments relate to a semiconductor memory device having an error correction function and a method of correcting errors in a semiconductor memory device.

2. Description of the Related Art

There are two typical methods to correct errors of input data in a semiconductor memory device according to operation modes.

The first method is to detect and correct errors in a normal mode, which includes a read mode and a write mode. In a write mode, parity is calculated from the input data. The input data is stored in a data cell array and the parity is stored in a parity cell array. In a read mode, the data stored in the data cell array and the parity stored in the parity cell array are compared with each other, and an error bit is detected. Then, the error bit is corrected and corrected data is output.

The second method is to detect and correct errors in a self-refresh mode. In a self-refresh mode, all bits of data stored in the data cell array are read, parity is calculated from the read data, and the parity is stored in a parity cell array. The data stored in the data cell array and the parity stored in the parity cell array are compared to detect one or more error bits, the error bits are corrected, and the corrected bits are written back to the data cell array.

When correcting errors in a normal mode, the write time and/or the read time may be long. When correcting errors in a self-refresh mode, time for entering and/or exiting time from the refresh mode may be long.

The two methods mentioned above may be used according to applications used in the semiconductor memory device. If the application permits a long self-refresh period, errors may be corrected in the self-refresh mode. In this case, the semiconductor memory devices, particularly for a portable electronic product, need to have reduced power consumption in the self-refresh mode.

SUMMARY OF THE INVENTION

Embodiments are therefore directed to a semiconductor memory device having an error correction function and an error correcting method, which substantially overcome one or more problems due to limitations and disadvantages of the related art.

It is therefore a feature of an embodiment to increase the refresh period.

It is therefore another feature of an embodiment to decrease power consumption in a refresh mode.

Some example embodiments of the present invention provide a semiconductor memory device having an error correction function and capable of adjusting a self-refresh period to reduce power consumption.

Some example embodiments of the present invention also provide a method of correcting errors in a semiconductor memory device capable of adjusting a self-refresh period to reduce power consumption.

In some embodiments of the present invention, a semiconductor memory device includes a parity generating circuit, a memory cell array, an error calculating circuit and an error corrector.

The parity generating circuit may generate at least one parity having different number of bits based on input data according to types of a partial array self-refresh mode, and selects one of the parities to output a first parity. The memory cell array may store the input data and the first parity.

The error calculating circuit may calculate an error based on a first data corresponding to the input data and a second parity corresponding to the first parity, generate at least one error data having different number of bits according to the types of the partial array self-refresh mode, and select one of the error data to output a first error data. The input data and the first parity may be received from the memory cell array. The error corrector may correct the first data to generate a second data based on the first data and the first error data.

In some embodiments, the partial array self-refresh mode may be determined by a mode register set signal.

In some embodiments, the parity generating circuit may include a parity generator and a multiplexer.

The parity generator may generate the parities having different number of bits based on the input data and the mode register set signal. The multiplexer may select one of the parities to output the first parity in response to the mode register set signal.

In some embodiments, the partial array self-refresh mode may include a full array self-refresh mode, a half array self-refresh mode and a quarter array self-refresh mode.

In some embodiments, the parity generator may include a full array parity generator, a half array parity generator and a quarter array parity generator.

The full array parity generator may generate a full array parity having a first number of bits based on the input data and the mode register set signal. The half array parity generator generates a half array parity having a second number of bits based on the input data and the mode register set signal. The quarter array parity generator may generate a quarter array parity having a third number of bits based on the input data and the mode register set signal.

In some embodiments, the first number of bits is eight, the second number of bits is sixteen, and the third number of bits is thirty-two.

In some embodiments, the full array parity generator is activated in the full array self-refresh mode, the half array parity generator is activated in the half array self-refresh mode, and the quarter array parity generator is activated in the quarter array self-refresh mode.

In some embodiments, the error calculator may include a full array error calculator, a half array error calculator and a quarter array error calculator.

The full array error calculator may generate a full array error data having a first number of bits based on the first data, the second parity and the mode register set signal. The half array error calculator generates a half array error data having a second number of bits based on the first data, the second parity and the mode register set signal. The quarter array error calculator generates a quarter array error data having a third number of bits based on the first data, the second parity and the mode register set signal.

In some embodiments, the decoder may include a full decoder, a half decoder and a quarter decoder.

The full decoder decodes the second error data to output the first error data in the full array self-refresh mode in response to the mode register set signal. The half decoder decodes the second error data to output the first error data in the half array self-refresh mode in response to the mode register set signal. The quarter decoder decodes the second error data to output the first error data in the quarter array self-refresh mode in response to the mode register set signal.

In some embodiments, the error correcting circuit may perform an exclusive OR operation on the first data and the first error data to generate the second data.

In some embodiments, the memory cell array may include a data cell array for storing the input data and a parity cell array for storing the parities.

In some embodiments, the parities may be stored in a portion of the memory cell array in which refresh operation is not performed.

At least one of the above and other features and advantages may be realized by providing a method of error correction includes generating at least one parity having different number of bits in response to a partial array self-refresh mode based on input data, selecting one of the parities to output a first parity, storing the input data and the first parity in the memory cell array, calculating an error based on a first data corresponding to the input data and a second parity corresponding to the first parity, generating at least one error data having different number of bits in response to the partial array self-refresh mode, selecting one of the error data to output a first error data, and correcting the first data to generate a second data based on the first data and the first error data.

BRIEF DESCRIPTION OF THE DRAWINGS

The above and other features and advantages of the present invention will become more apparent to those of ordinary skill in the art by describing in detail exemplary embodiments thereof with reference to the attached drawings, in which:

FIG. 12 is a table illustrating a relationship between a refresh period and the number of error bits that can be corrected according to types of partial array self-refresh.

DETAILED DESCRIPTION OF THE INVENTION

Korean Patent Application No. 2007-16584, filed on Feb. 16, 2007, in the Korean Intellectual Property Office, and entitled: "Semiconductor Memory Device Having an Error Correction Function and Method of Error Correction," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
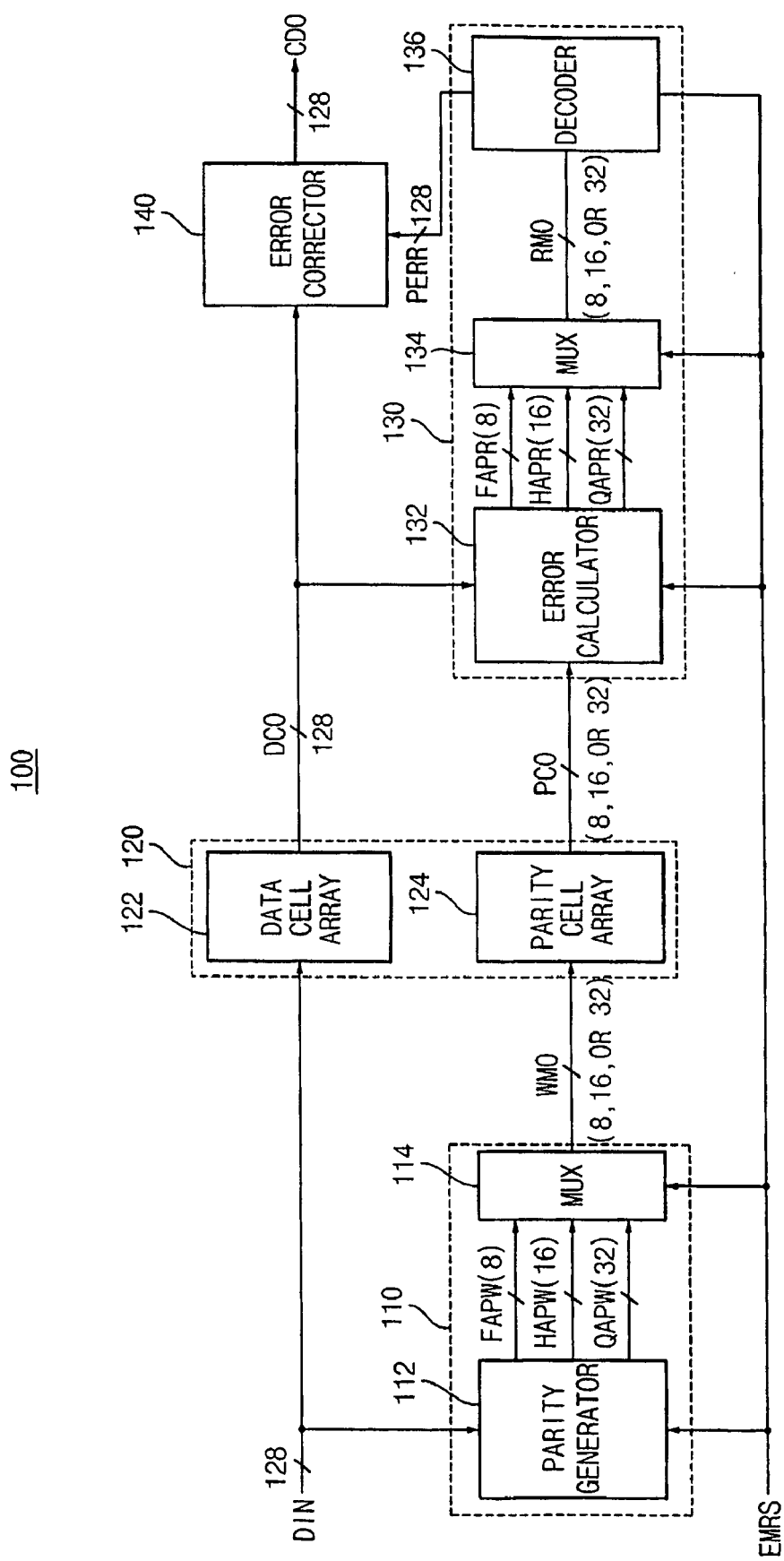
FIG. 1 illustrates a block diagram of a semiconductor memory device having an error correction function according to an example embodiment of the present invention.

FIG. 1 illustrates a block diagram of a semiconductor memory device 100 having an error correction function according to an example embodiment of the present invention. Referring to FIG. 1, the semiconductor memory device 100 may include a parity generating circuit 110, a memory cell array 120, an error calculating circuit 130, and an error corrector 140.

For convenience of description, it is assumed that input data DIN is 128-bit data. The parity generating circuit 110 may generate parities FAPW, HAPW and QAPW having different number of bits (8, 16, and 32 bits, respectively) based on input data DIN according to types of a partial array self-refresh mode (PASR), and select one of the parities FAPW, HAPW, and QAPW to output a first parity WMO. The input data DIN and the first parity WMO may be stored in the memory cell array 120.

The error calculating circuit 130 may calculate an error based on a first data DCO corresponding to the input data DIN and a second parity PCO corresponding to the first parity WMO. The error calculating circuit 130 may also generate error data FAPR, HAPR, and QAPR having different number of bits (8, 16, and 32 bits, respectively) in response to the partial array self-refresh mode, and select one of the error data FAPR, HAPR, and QAPR to output a first error data PERR. The input data DIN and the first parity WMO may be received from the memory cell array 120. The error corrector 140 may correct the first data DCO to generate a second data CDO based on the first data DCO and the first error data PERR.

As illustrated in FIG. 1, the partial array self-refresh mode PASR may be determined by an extended mode register set signal (EMRS). The extended mode register set signal EMRS is a kind of a mode register set signal (MRS), and may be generated by a combination of commands in a semiconductor memory device.

The parity generating circuit 110 may include a parity generator 112 and a first multiplexer 114. The parity generator 112 may generate the parities FAPW, HAPW, and QAPW having different number of bits (8, 16, and 32 bits, respectively) based on the input data DIN and the extended mode register set signal EMRS. The first multiplexer 114 may select one of the parities FAPW, HAPW, and QAPW to output the first parity WMO in response to the extended mode register set signal EMRS.

The error calculating circuit 130 may include an error calculator 132, a second multiplexer 134, and a decoder 136. The error calculator 132 may calculate the error in response to the first data DCO and the second parity PCO, and generate the error data FAPR, HAPR, and QAPR having different number of bits (8, 16 and 32 bits, respectively) in response to the extended mode register set signal EMRS. The second multiplexer 134 may select one of the error data FAPR, HAPR, and QAPR, to output second error data RMO in response to the extended mode register set signal EMRS. The decoder 136 may decode the second error data RMO to output the first error data PERR in response to the extended mode register set signal EMRS.

Operation of the semiconductor memory device 100 illustrated in FIG. 1 will now be described. Error correction of the semiconductor memory device 100 illustrated in FIG. 1 may use a Hamming code, e.g., (136, 128) Hamming code, (144, 128) Hamming code, and (160, 128) Hamming code.

The input data DIN of 128 bits may be provided to the semiconductor memory device 100. The input data DIN may be stored in the data cell array 122, and provided to the parity generator 112. The parity generator 112 may generate the parities FAPW, HAPW, and QAPW having different number of bits based on the input data DIN and the extended mode register set signal EMRS. The partial array self-refresh mode (PASR) may be determined by the extended mode register set signal (EMRS).

The partial array self-refresh mode may include a full array self-refresh mode, a half array self-refresh mode, and a quarter array self-refresh mode. The parity generator 112 may generate the parity FAPW having eight bits in the full array self-refresh mode, generate the parity HAPW having sixteen bits in the half array self-refresh mode, and generate the parity QAPW having thirty-two bits in the quarter array self-refresh mode. The first multiplexer 114 may select one of the parities FAPW, HAPW and QAPW to output the first parity WMO in response to the extended mode register set signal EMRS. The first parity WMO may be one of the parity FAPW having eight bits, the parity HAPW having sixteen bits, and the parity QAPW having thirty-two bits. The first parity WMO may be stored in the parity cell array 124.

The error calculator 132 may calculate the error in response to the first data DCO and the second parity PCO, and generate the error data FAPR, HAPR and QAPR having different number of bits in response to the extended mode register set signal EMRS. The error calculator 132 may generate the parity FAPR having eight bits in the full array self-refresh mode, the parity HAPR having sixteen bits in the half array self-refresh mode, and the parity QAPR having thirty-two bits in the quarter array self-refresh mode. The second multiplexer 134 may select one of the error data FAPR, HAPR, and QAPR, and output a second error data RMO in response to the extended mode register set signal EMRS. The second error data RMO may be one of the error data FAPR having eight bits, the error data HAPR having sixteen bits, and the error data QAPR having thirty-two bits. The decoder 136 may decode the second error data RMO and output the first error data PERR in response to the extended mode register set signal EMRS.

The semiconductor memory device 100 illustrated in FIG. 1 may adjust the number of parity bits depending on the types of the partial array self-refresh mode. A memory cell array may include a plurality of memory banks. For example, in the half array self-refresh mode, refresh operation is not performed for one half of the memory banks. Therefore, one half of the memory bank in which refresh operation is not performed may be used for storing parity bits in the half array self-refresh mode. In the quarter array self-refresh mode, refresh operation is not performed for three fourths of the memory banks. Therefore, three fourths of the memory bank in which refresh operation is not performed may be used for storing parity bits in the quarter array self-refresh mode.

Accordingly, the semiconductor memory device 100 illustrated in FIG. 1 may increase the number of parity bits and the number of data bits that may be corrected according to the partial array self-refresh mode. As a result, the semiconductor memory device 100 illustrated in FIG. 1 may increase a refresh period and may decrease power consumption during the refresh operation.

Figure 2:
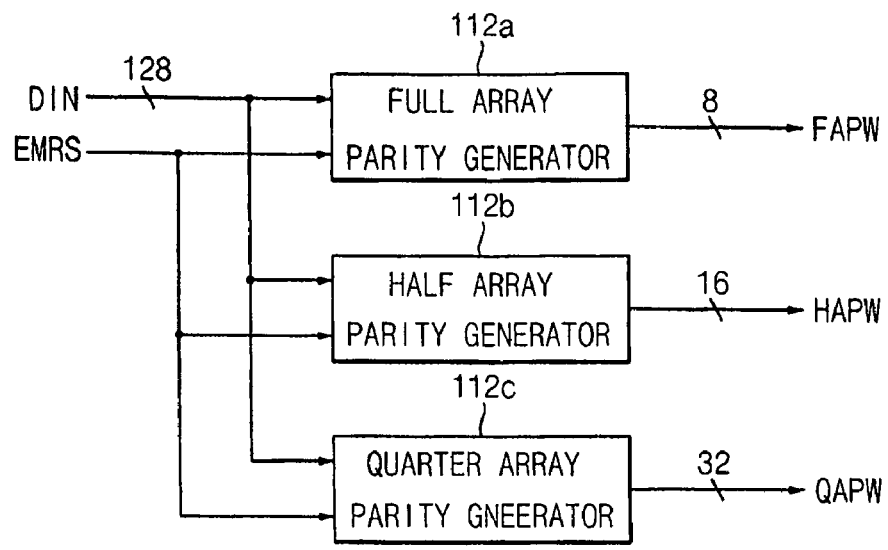
FIG. 2 illustrates a block diagram of an example of a parity generator included in the semiconductor memory device of FIG. 1.

FIG. 2 illustrates a block diagram of an example of the parity generator 112 included in the semiconductor memory device 100 of FIG. 1. Referring to FIG. 2, the parity generator 112 may include a full array parity generator 112a, a half array parity generator 112b, and a quarter array parity generator 112c.

The full array parity generator 112a may generate a full array parity FAPW having eight bits based on the input data DIN and the extended mode register set signal EMRS. The half array parity generator 112b generates a half array parity HAPW having sixteen bits based on the input data DIN and the extended mode register set signal EMRS. The quarter array parity generator 112c generates a quarter array parity QAPW having thirty-two bits based on the input data DIN and the extended mode register set signal EMRS. In the parity generator 112 illustrated in FIG. 2, the partial array self-refresh mode PASR may be determined in response to the extended mode register set signal EMRS.

Figure 3:
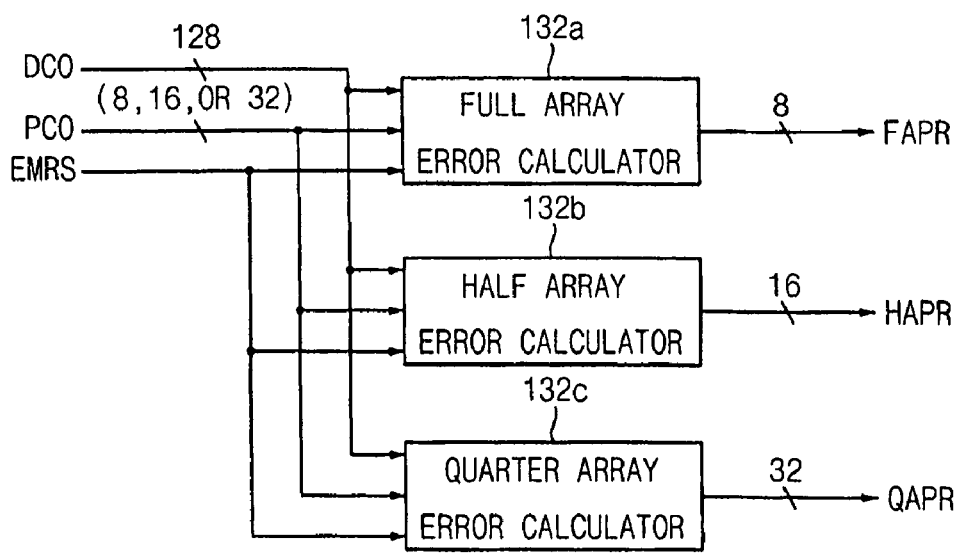
FIG. 3 illustrates a block diagram of an example of an error calculator included in the semiconductor memory device of FIG. 1.
Figure 4:
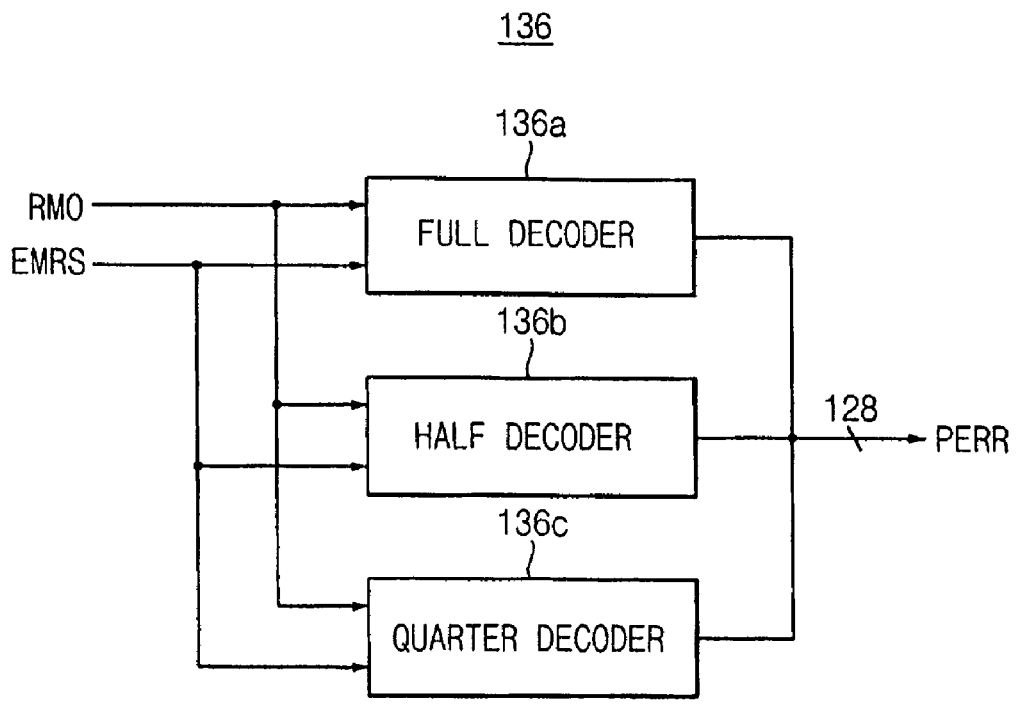
FIG. 4 illustrates a block diagram of an example of a decoder included in the semiconductor memory device of FIG. 1.

FIG. 3 illustrates a block diagram of an example of the error calculator 132 included in the semiconductor memory device 100 of FIG. 2. Referring to FIG. 4, the error calculator 132 may include a full array error calculator 132a, a half array error calculator 132b, and a quarter array error calculator 132c.

The full array error calculator 132a may generate a full array error data FAPR having eight bits based on the first data DCO, the second parity PCO, and the extended mode register set signal EMRS. The half array error calculator 132b may generate a half array error data HAPR having sixteen bits based on the first data DCO, the second parity PCO, and the extended mode register set signal EMRS. The quarter array error calculator 132c may generate a quarter array error data QAPR having thirty-two bits based on the first data DCO, the second parity PCO, and the extended mode register set signal EMRS. In the error calculator 132 illustrated in FIG. 3, the partial array self-refresh mode may be determined in response to the extended mode register set signal EMRS.

FIG. 4 illustrates a block diagram of an example of the decoder 136 included in the semiconductor memory device 100 of FIG. 1. Referring to FIG. 4, the decoder 136 may include a full decoder 136a, a half decoder 136b, and a quarter decoder 136c.

The full decoder 136a may decode the second error data RMO to output the first error data PERR in the full array self-refresh mode in response to the extended mode register set signal EMRS. The half decoder 136b may decode the second error data RMO to output the first error data PERR in the half array self-refresh mode in response to the extended mode register set signal EMRS. The quarter decoder 136c may decode the second error data RMO to output the first error data PERR in the quarter array self-refresh mode in response to the extended mode register set signal EMRS.

Figure 5:
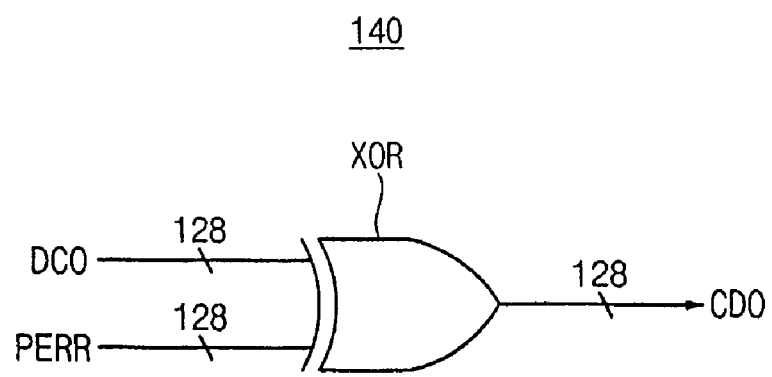
FIG. 5 illustrates a circuit diagram of an example of an error corrector included in the semiconductor memory device of FIG. 1.

FIG. 5 illustrates a circuit diagram of an example of the error corrector 140 included in the semiconductor memory device 100 of FIG. 1. Referring to FIG. 5, the error corrector 140 may include an exclusive OR gate XOR that performs an exclusive OR operation on the first data DCO and the first error data PERR to generate the second data CDO.

FIGS. 6 to 10 illustrate a partial array self-refresh (PASR) operation of a semiconductor memory device having four memory banks A, B, C, and D.

Figure 6:
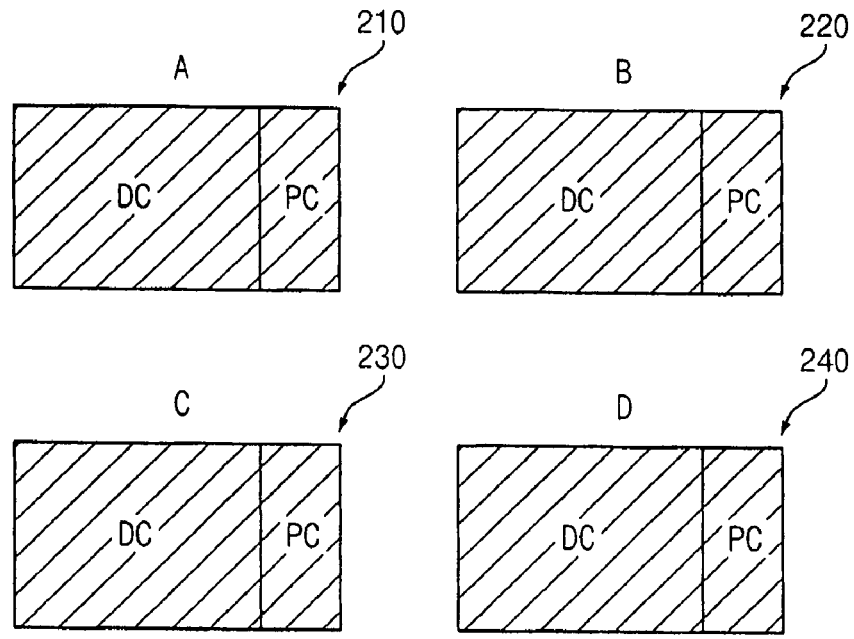
FIGS. 6 to 10 illustrate describing a partial array self-refresh operation of a semiconductor memory device having four memory banks.
Figure 7:
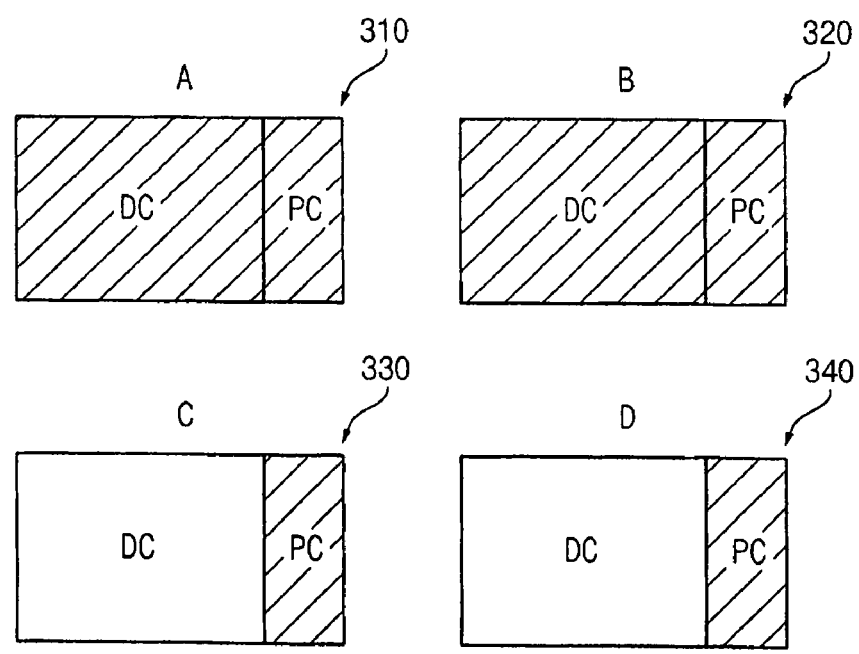
Figure 8:
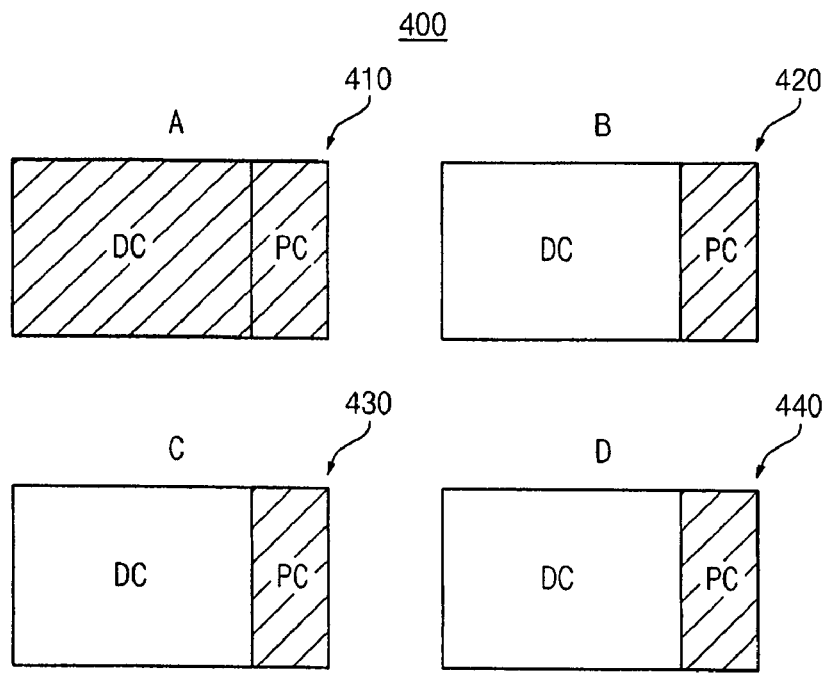

FIG. 6 illustrates a memory cell array in the full array self-refresh mode, FIG. 7 illustrates a memory cell array in the half array self-refresh mode, and FIG. 8 illustrates a memory cell array in the quarter array self-refresh mode. That is, the partial array self-refresh mode may include the full array self-refresh mode, the half array self-refresh mode, and the quarter array self-refresh mode.

FIG. 6 illustrates a memory cell array 200 when all of the four memory banks 210, 220, 230 and 240 are refreshed. FIG. 7 illustrates a memory cell array 300 when two memory banks 310 and 320 of the four memory banks 310, 320, 330 and 340 are refreshed, and the remaining memory banks 330 and 340 are not refreshed. FIG. 8 illustrates a memory cell array 400 when one 410 of the four memory banks 410, 420, 430 and 440 is refreshed, and the remaining memory banks 420, 430 and 440 are not refreshed.

In the memory cell arrays 200, 300 and 400 illustrated in FIG. 6, FIG. 7 and FIG. 8, each of the banks A, B, C and D may include a data cell array DC and a parity cell array PC. The data cell array DC and the parity cell array PC are used for storing the input data and the parities, respectively.

Figure 9:
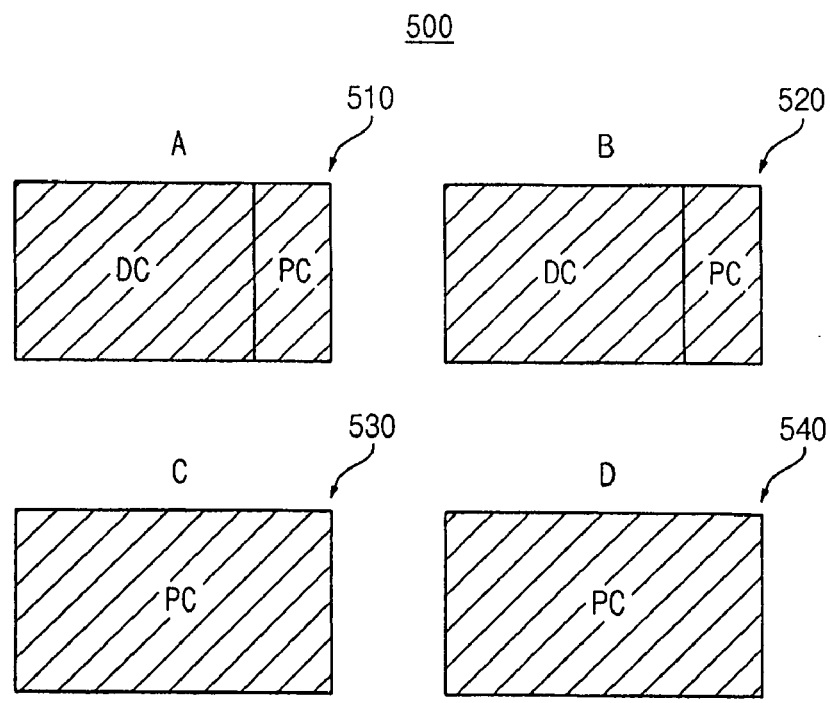

In the memory cell array 500 illustrated in FIG. 9, two memory banks 510 and 520 may be divided into a data cell array DC and a parity cell array PC. However, two other memory banks 530 and 540 may include only a parity cell array PC for storing parities.

Figures 10, 11:
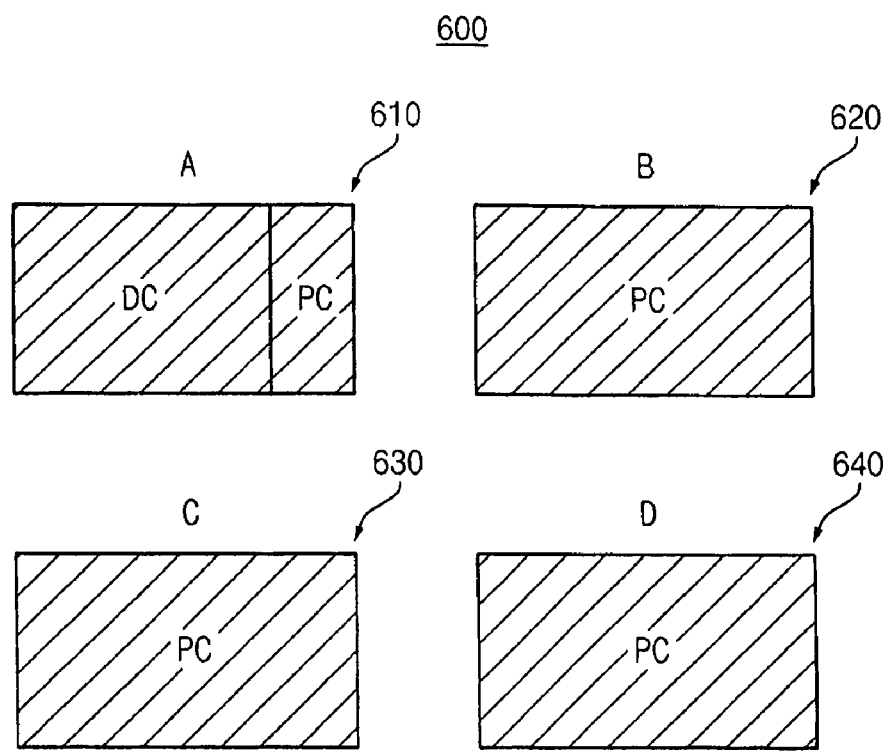
FIG. 11 is a table illustrating the number of parity bits and corresponding cell overheads.

In the memory cell array 600 illustrated in FIG. 10, one memory bank 610 of memory banks 610, 620, 630 and 640 may be divided into a data cell array DC and a parity cell array PC. However, three other memory banks 620, 630 and 640 may include only a parity cell array PC for storing parities.

Referring to the memory cell array 200 illustrated in FIG. 6, all of the four memory banks 210, 220, 230 and 240 are refreshed, and data are stored in the data cell array DC and parities are stored in the parity cell array PC.

Referring to the memory cell array 300 illustrated in FIG. 7, two memory banks 310 and 320 of the four memory banks 310, 320, 330 and 340 are refreshed, and the rest memory banks 330 and 340 are not refreshed. Data are stored in the data cell array DC of the memory banks 310 and 320 and parities are stored in the parity cell array PC of the memory banks 310 and 320. In the example embodiment of the present invention, the data cell arrays DC in the memory banks 330 and 340 are not used in a refresh mode and parities may be stored in the parity cell array PC.

Referring to the memory cell array 400 illustrated in FIG. 8, one memory bank 410 of the four memory banks 410, 420, 430 and 440 is refreshed, and remaining memory banks 420, 430 and 440 are not refreshed. Data are stored in the data cell array DC of the memory bank 410 and parities are stored in the parity cell array PC of the memory bank 410. In the example embodiment of the present invention, the data cell arrays DC in the memory banks 420, 430 and 440 are not used in a refresh mode and parities may be stored in the parity cell array PC.

Referring to the memory cell array 500 illustrated in FIG. 9, two memory banks 510 and 520 of the four memory banks 510, 520, 530 and 540 are refreshed, and remaining memory banks 530 and 540 are not refreshed. Data are stored in the data cell array DC of the memory banks 510 and 520 and parities are stored in the parity cell array PC of the memory banks 510 and 520. In the example embodiment of the present invention, parities may be stored in the entirety of the memory banks 530 and 540, which now only serve as parity cell arrays PC.

Referring to the memory cell array 600 illustrated in FIG. 10, one memory bank 610 of the four memory banks 610, 620, 630 and 640 are refreshed, and remaining memory banks 620, 630 and 640 are not refreshed. Data are stored in the data cell array DC of the memory bank 610 and parities are stored in the parity cell array PC of the memory bank 610. In the example embodiment of the present invention, parities may be stored in the entirety of the memory banks 620, 630 and 640, which now only serve as parity cell arrays PC.

FIG. 11 is a table illustrating the number of parity bits and corresponding cell overheads. The table of FIG. 11 illustrates changes of the number of parity bits and a cell overhead when the number of data bits is increased in case that the error correction is performed using the Hamming code for correcting one bit.

Referring to FIG. 12, the number of parity bits for correcting one error bit included in data is four when the number of data bits is eight, five when the number of data bits is sixteen, six when the number of data bits is thirty-two, seven when the number of data bits is sixty-four, and eight when the number of data bits is 128. That is, the number of parity bits required for correcting the same number of error bits increases as the number of data bits increases. On the contrary, the cell overhead required for correcting the same number of error bits decreases as the number of data bits increases.

In FIG. 12, the number of parity bits required for correcting two error bits may be eight when the number of data bits is sixteen because the number of parity bits required for correcting one error bit is four when the number of data bits is eight. That is, the number of parity bits required for correcting error bits may be increased as the number of error bits is increased. Therefore, in the semiconductor memory device that operates in a partial array self-refresh mode PASR, the memory banks in which refresh operation is not performed in a refresh mode may be used to store parity bits.

FIG. 12 is a table illustrating a relationship between a refresh period and the number of error bits that can be corrected according to types of partial array self-refresh. FULL ARRAY denotes a memory cell array in which all the memory banks are refreshed in a refresh mode. HALF ARRAY denotes a memory cell array in which a half of the memory banks is refreshed in a refresh mode. QUARTER ARRAY denotes a memory cell array in which a quarter of the memory banks is refreshed in a refresh mode.

Referring to FIG. 12, for the FULL ARRAY, the refresh period is T, and the number of error bits that can be corrected is one per 128 data bits. For the HALF ARRAY, the refresh period is longer than that of T, and the number of error bits that can be corrected is more than one per 128 data bits. For the QUARTER ARRAY, the refresh period is longer than that of HALF ARRAY, and the number of error bits that can be corrected is more than that of HALF ARRAY because parity bits may be stored in memory banks that are not refreshed in a refresh mode, but are refreshed for FULL ARRAY and HALF ARRAY.

As described above, the semiconductor memory device according to the embodiments may increase the number of parity bits according to a partial array self-refresh mode, and may increase data bits to be corrected by using memory banks in which refresh operation is not performed in a refresh mode. Therefore, the semiconductor memory device according to embodiments may increase the refresh period and may decrease a power consumption in a refresh mode.

Exemplary embodiments of the present invention have been disclosed herein, and although specific terms are employed, they are used and are to be interpreted in a generic and descriptive sense only and not for purpose of limitation. For example, the error correcting of embodiments may be implemented in software, e.g., by an article of manufacture having a machine-accessible medium including data that, when accessed by a machine, cause the machine to generate corrected data. Accordingly, it will be understood by those of ordinary skill in the art that various changes in form and details may be made without departing from the spirit and scope of the present invention as set forth in the following claims.

What is claimed is:

1. A semiconductor memory device, comprising:
   a parity generating circuit configured to generate at least two parities having different number of bits based on input data according to types of a partial array self-refresh mode, to select one of the parities, and to output a first parity;
   a memory cell array configured to store the input data and the first parity;
   an error calculating circuit configured to receive the input data and the first parity being received from the memory cell array, to calculate an error based on a first data corresponding to the input data and a second parity corresponding to the first parity, to generate at least one error data having different number of bits according to the types of the partial array self-refresh mode, and to select one of the error data to output a first error data; and
   an error corrector configured to generate a second data based on the first data and the first error data.

2. The semiconductor memory device as claimed in claim 1, wherein the partial array self-refresh mode is determined by a mode register set signal.

3. The semiconductor memory device as claimed in claim 2, wherein the parity generating circuit includes:
   a parity generator configured to generate the parities having different number of bits based on the input data and the mode register set signal; and
   a multiplexer configured to select one of the parities to output the first parity in response to the mode register set signal.

4. The semiconductor memory device as claimed in claim 3, wherein the partial array self-refresh mode includes a full array self-refresh mode, a half array self-refresh mode, and a quarter array self-refresh mode.

5. The semiconductor memory device as claimed in claim 4, wherein the parity generator includes:
   a first array parity generator configured to generate a first array parity having a first number of bits based on the input data and the mode register set signal;
   a second array parity generator configured to generate a second array parity having a second number of bits based on the input data and the mode register set signal; and
   a third array parity generator configured to generate a third array parity having a third number of bits based on the input data and the mode register set signal.

6. The semiconductor memory device as claimed in claim 5, wherein the first number of bits is eight, the second number of bits is sixteen, and the third number of bits is thirty-two.

7. The semiconductor memory device as claimed in claim 4, wherein the full array parity generator is activated in the full array self-refresh mode, the half array parity generator is activated in the half array self-refresh mode, and the quarter array parity generator is activated in the quarter array self-refresh mode.

8. The semiconductor memory device as claimed in claim 2, wherein the error calculating circuit includes:
   an error calculator configured to calculate the error in response to the first data and the second parity, and to generate the error data having different number of bits in response to the mode register set signal;
   a multiplexer configured to select one of the error data and to output a second error data in response to the mode register set signal; and
   a decoder configured to decode the second error data and to output the first error data in response to the mode register set signal.

9. The semiconductor memory device as claimed in claim 8, wherein the partial array self-refresh mode includes a full array self-refresh mode, a half array self-refresh mode, and a quarter array self-refresh mode.

10. The semiconductor memory device as claimed in claim 9, wherein the error calculator includes:
    a full array error calculator configured to generate a full array error data having a first number of bits based on the first data, the second parity, and the mode register set signal;
    a half array error calculator configured to generate a half array error data having a second number of bits based on the first data, the second parity, and the mode register set signal; and
    a quarter array error calculator configured to generate a quarter array error data having a third number of bits based on the first data, the second parity, and the mode register set signal.

11. The semiconductor memory device as claimed in claim 10, wherein the first number of bits is eight, the second number of bits is sixteen, and the third number of bits is thirty-two.

12. The semiconductor memory device as claimed in claim 10, wherein the full array error calculator is activated in the full array self-refresh mode, the half array error calculator is activated in the half array self-refresh mode, and the quarter array error calculator is activated in the quarter array self-refresh mode.

13. The semiconductor memory device as claimed in claim 9, wherein the decoder includes:
    a full decoder configured to decode the second error data and to output the first error data in the full array self-refresh mode in response to the mode register set signal;
    a half decoder configured to decode the second error data and to output the first error data in the half array self-refresh mode in response to the mode register set signal; and a quarter decoder configured to decode the second error data and to output the first error data in the quarter array self-refresh mode in response to the mode register set signal.

14. The semiconductor memory device as claimed in claim 2, wherein the error correcting circuit is configured to perform an exclusive OR operation on the first data and the first error data to generate the second data.

15. The semiconductor memory device as claimed in claim 1, wherein the memory cell array includes:
   a data cell array for storing the input data; and
   a parity cell array for storing the parities.

16. The semiconductor memory device as claimed in claim 1, wherein the parities are stored in a portion of the memory cell array in which refresh operation is not performed.

17. A method of correcting errors in a semiconductor memory device, comprising:
   generating at least two parities having different number of bits in response to a partial array self-refresh mode based on input data;
   selecting one of the parities as a first parity;
   storing the input data and the first parity in the memory cell array;
   calculating an error based on a first data corresponding to the input data and a second parity corresponding to the first parity;
   generating at least one error data having different number of bits in response to the partial array self-refresh mode;
   selecting one of the error data as a first error data; and
   correcting the first data to generate a second data based on the first data and the first error data.

18. The method as claimed in claim 17, further comprising determining the partial array self-refresh mode using a mode register set signal.

19. The method as claimed in claim 18, wherein generating at least one parity includes:
   generating a first array parity having a first number of bits based on the input data and the mode register set signal;
   generating a second array parity having a second number of bits based on the input data and the mode register set signal; and
   generating a third array parity having a third number of bits based on the input data and the mode register set signal.

20. The method as claimed in claim 18, wherein calculating the error includes:
   calculating the error in response to the first data and the second parity;
   generating the error data having different number of bits in response to the mode register set signal;
   selecting one of the error data and to output a second error data in response to the mode register set signal; and
   decoding the second error data to output the first error data in response to the mode register set signal.

* * * * *